(12) United States Patent
Fukuzumi et al.

(10) Patent No.: US 7,505,306 B2
(45) Date of Patent: Mar. 17, 2009

(54) MAGNETIC MEMORY DEVICE

(75) Inventors: Yoshiaki Fukuzumi, Yokohama (JP); Toshihiko Nagase, Sagamihara (JP); Yoshiaki Asao, Sagamihara (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 66 days.

(21) Appl. No.: 11/609,487

(22) Filed: Dec. 12, 2006

(65) Prior Publication Data

US 2008/0002459 A1 Jan. 3, 2008

(30) Foreign Application Priority Data

Jun. 28, 2006 (JP) ............................. 2006-178391

(51) Int. Cl.
*G11C 11/00* (2006.01)

(52) U.S. Cl. ...................... 365/158; 365/171; 365/173

(58) Field of Classification Search ................. 365/158, 365/173, 171, 225.5, 230.06, 51, 52, 185.23, 365/185.24
See application file for complete search history.

(56) References Cited

U.S. PATENT DOCUMENTS 7,084,447 B2 8/2006 Fukuzumi et al.

2005/0072997 A1* 4/2005 Kikuchi et al. .............. 257/295
2006/0039190 A1* 2/2006 Kim et al. ................... 365/158

FOREIGN PATENT DOCUMENTS

| JP | 2001-084756 | 3/2001 |
| JP | 2002-368306 | 12/2002 |
| JP | 2003-142753 | 5/2003 |
| JP | 2005-530340 | 10/2005 |
| WO | 03/107350 | 12/2003 |

* cited by examiner

*Primary Examiner*—Dang T Nguyen
(74) *Attorney, Agent, or Firm*—Oblon, Spivak, McClelland, Maier & Neustadt, P.C.

(57) ABSTRACT

A magnetic memory device includes a magnetization fixed layer provided above a semiconductor substrate surface and having a fixed magnetization direction. A first magnetization free layer is provided above the magnetization fixed layer, has variable magnetization direction, and has an easy magnetization axis extending along a plane intersecting the substrate surface and along a direction neither parallel nor perpendicular to the substrate surface. A second magnetization free layer is provided above the first magnetization free layer, has a magnetization that antiferromagnetically couples with the first magnetization free layer. A first write line is placed above and electrically connected to the second magnetization free layer, and extends in a direction that pierces the plane. A second write line faces the first and/or second magnetization free layer, and extends along the substrate surface and the plane and in a direction perpendicular to the first write line.

17 Claims, 8 Drawing Sheets

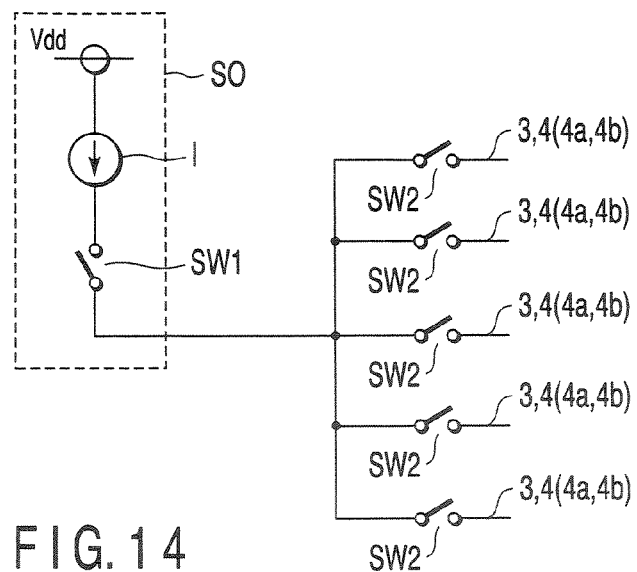
F I G. 14
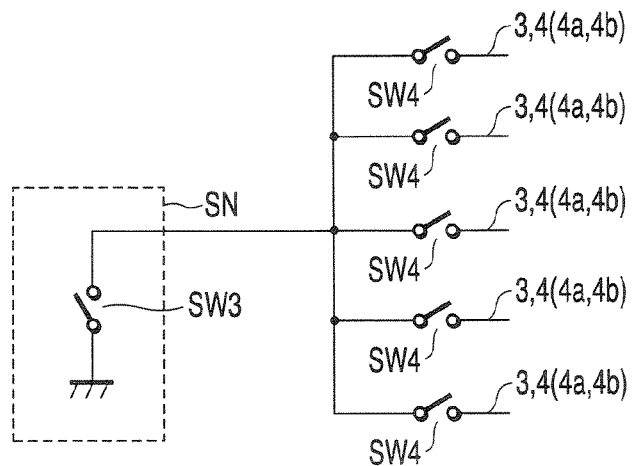
F I G. 15
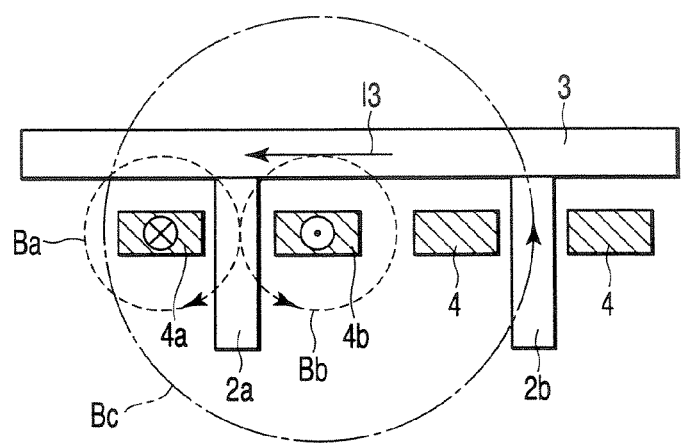
F I G. 18

MAGNETIC MEMORY DEVICE

CROSS-REFERENCE TO RELATED APPLICATIONS

This application is based upon and claims the benefit of priority from prior Japanese Patent Application No. 2006-178391, filed Jun. 28, 2006, the entire contents of which are incorporated herein by reference.

BACKGROUND OF THE INVENTION

1. Field of the Invention

The present invention relates to a magnetic memory device, such as the arrangement of a memory cell and a write line.

2. Description of the Related Art

A magnetic random-access memory (MRAM) has a feature of having a memory cell of a magnetoresistive element that uses the magnetoresistive effect to store data and use a current to perform a write operation.

A magnetoresistive element is an element that uses the tunneling magnetoresistive effect, generally has a structure wherein one insulating layer is sandwiched between two ferromagnetic layers. One of the ferromagnetic layers is called a reference layer whose magnetization direction is fixed. The other one is called a recording layer whose magnetization direction is not fixed. The tunneling magnetoresistive effect is a phenomenon wherein a tunneling current changes when the magnetization direction of two ferromagnetic layers are parallel and anti-parallel.

By assigning a corresponding parallelism or anti-parallelism of the magnetization direction of the two ferromagnetic layers to "0" data and "1" data, the magnetoresistive element can retain 1 bit of data. A write operation is implemented by changing parallelism or anti-parallelism of a magnetization direction of the recording layer with the reference layer by a magnetic field generated by a current.

In order to realize a large-scale MRAM, the following three problems need to be dealt with: 1) to prevent a current flowing in a write line for writing to a magnetoresistive element of a write target from erroneously writing to a magnetoresistive element adjacent the target element, 2) to retain a high degree of thermal disturbance resistance of a magnetoresistive element, 3) to keep a current low.

As a countermeasure to the problems, a so-called toggle-writing is proposed (e.g., U.S. Pat. No. 6,545,906B1). Toggle writing uses two antiferromagnetically coupled ferromagnetic layers as ferromagnetic layers for recording data. Furthermore, the way it applies a magnetic field at the time of writing data is different from the above general way of writing. Toggle writing improves resistance against erroneous writing to an adjacent magnetoresistive element. However, the intensity of the magnetic field to switch the data retained by a magnetoresistive element is considerably larger than for a single layer recording layer. Therefore, along with miniaturization, the current for writing is expected to be over acceptable level. More specifically, for example, in a generation in which the length of the short side of a magnetoresistive element is less than 50 nm, realization of MRAM is very difficult to achieve.

BRIEF SUMMARY OF THE INVENTION

According to an aspect of the present invention, there is provided a magnetic memory device comprising: a semiconductor substrate; a magnetization fixed layer provided above a surface of the semiconductor substrate and having a fixed magnetization direction; a first magnetization free layer provided above the magnetization fixed layer, having variable magnetization direction, and having an easy magnetization axis which extends along a plane intersecting the surface of the semiconductor substrate and along a direction neither parallel nor perpendicular to the surface of the semiconductor substrate; a second magnetization free layer provided above the first magnetization free layer, having a magnetization that antiferromagnetically couples with the first magnetization free layer when no external magnetic field is applied; a first write line provided above and electrically connected to the second magnetization free layer, and extending in a direction that pierces the plane; and a second write line facing at least one of the first magnetization free layer and the second magnetization free layer, and extending along the surface of the semiconductor substrate and the plane and in a direction perpendicular to the first write line.

BRIEF DESCRIPTION OF THE SEVERAL VIEWS OF THE DRAWING

FIG. 14 shows a source circuit.

FIG. 15 shows a sink circuit.

FIG. 18 describes resistance to erroneous writing which the invention's embodiments exhibit.

DETAILED DESCRIPTION OF THE INVENTION

The following is a description of embodiments of the invention using diagrams. In addition, in the following descriptions, identical description is used for the component parts that have roughly the same functions and compositions, and a duplicate description is given only when necessary.

Figure 1:
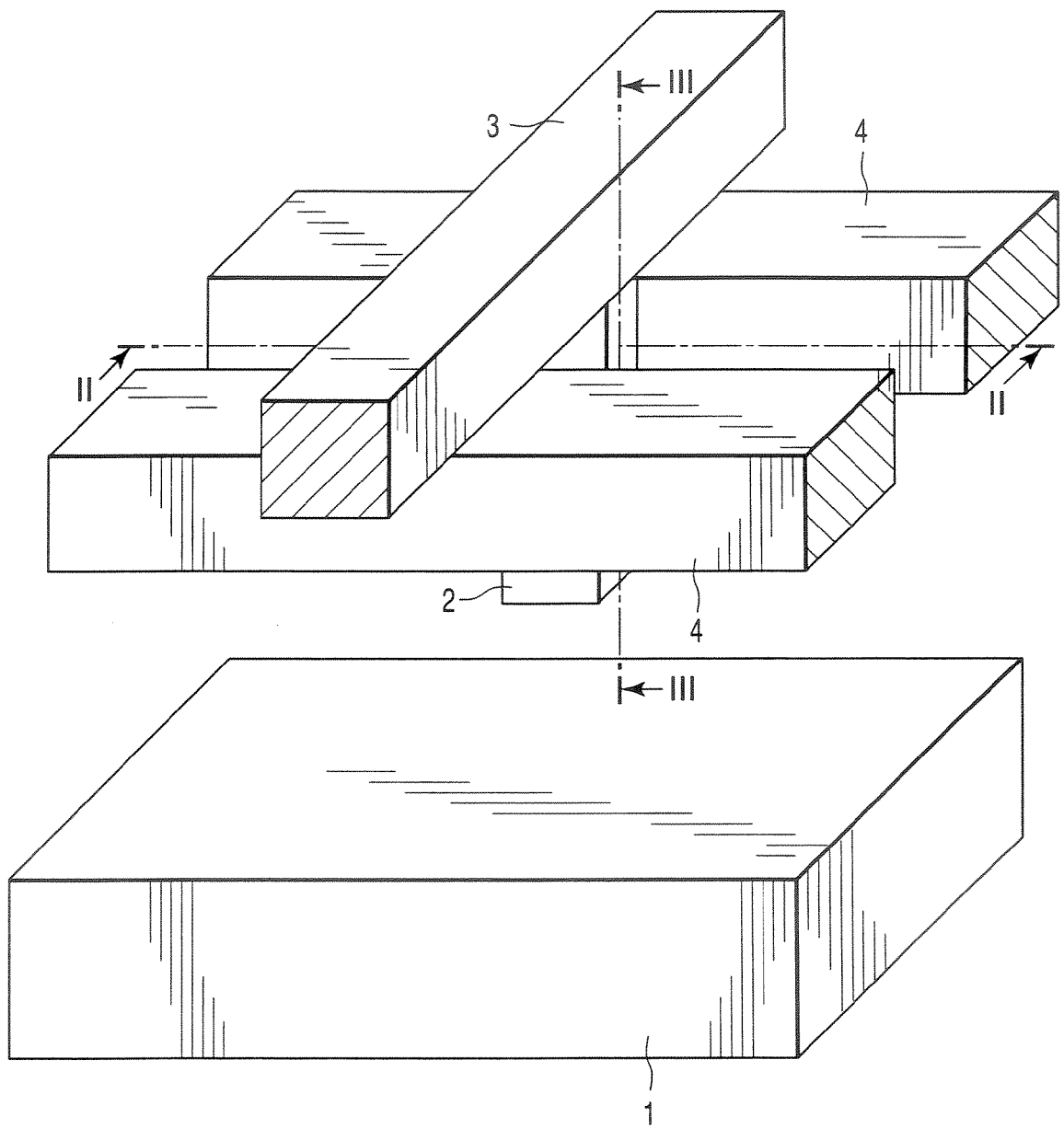
FIG. 1 is a perspective diagram of a major part of the magnetic memory device according to the invention's embodiments.
Figure 2:
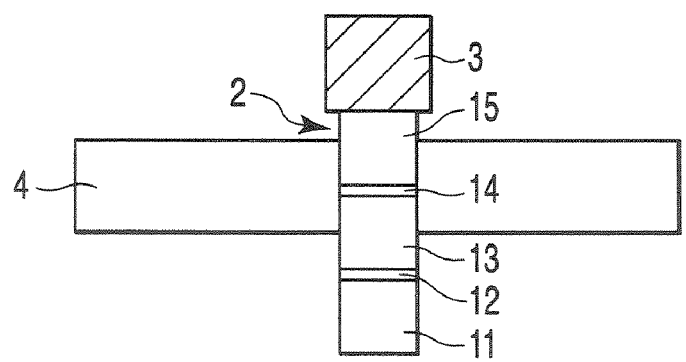
FIG. 2 is a cross-sectional diagram along the II-II line of FIG. 1.
Figure 2:
Figure 3:
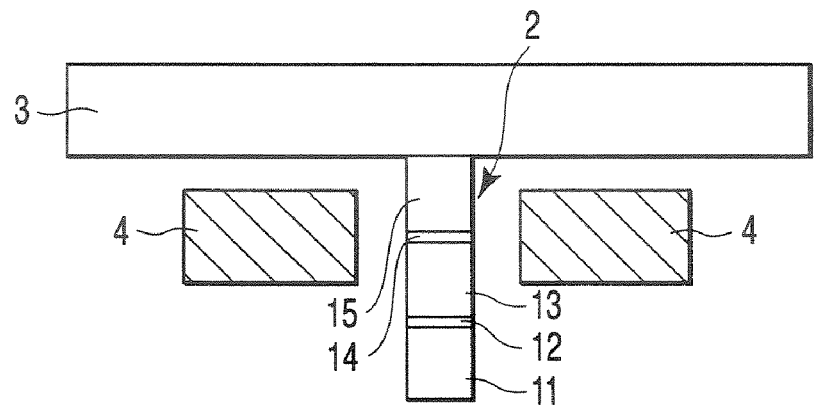
FIG. 3 is a cross-sectional diagram along the III-III line of FIG. 1.
Figure 3:
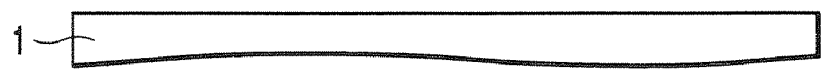

The embodiments of the invention are described by referring to FIG. 1 to FIG. 18. FIG. 1 is an perspective diagram of a major part of the magnetic memory device according to the invention's embodiments. FIG. 2 and FIG. 3 are cross-sectional diagrams along the II-II line and III-III line of FIG. 1, respectively. FIG. 1 to FIG. 3 illustrates only two types of write lines of a semiconductor substrate and magnetoresistive element for simplification. A configuration including other parts will be described later using FIG. 7.

As indicated in FIG. 1 to FIG. 3, the magnetoresistive element 2 is provided above the semiconductor substrate 1. For example, the magnetoresistive element 2 has a cuboid shape. Here, the magnetoresistive element 2 can take two static states by toggle writing and shows the magnetoresistive effect, and includes, a ferromagnetic layer 11, a nonmagnetic layer 12, a ferromagnetic layer 13, a nonmagnetic layer 14, and a ferromagnetic layer 15 which are stacked as indicated in FIG. 2 to FIG. 4 as a typical example.

Figure 4:
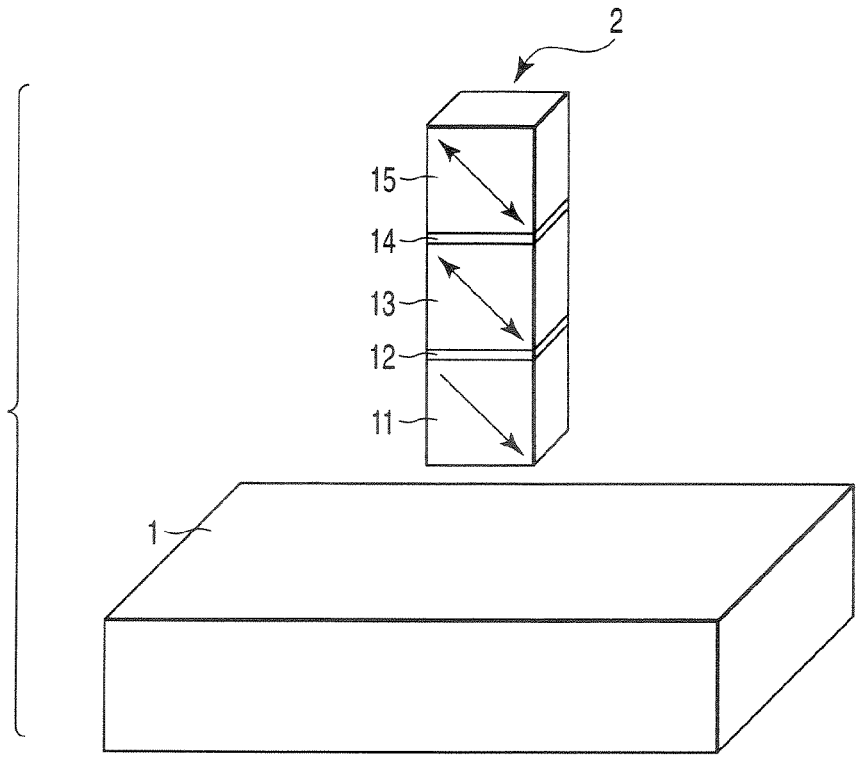
FIG. 4 is a perspective diagram that mainly shows the magnetoresistive element according to the invention's embodiments.
Figure 5:
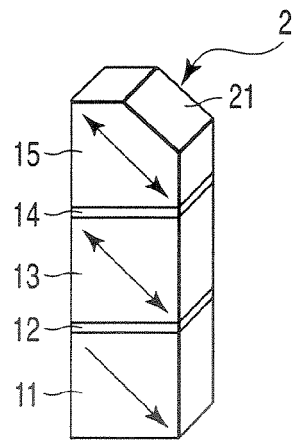
FIG. 5 is a perspective diagram of the magnetoresistive element according to the invention's other embodiments.
Figure 6:
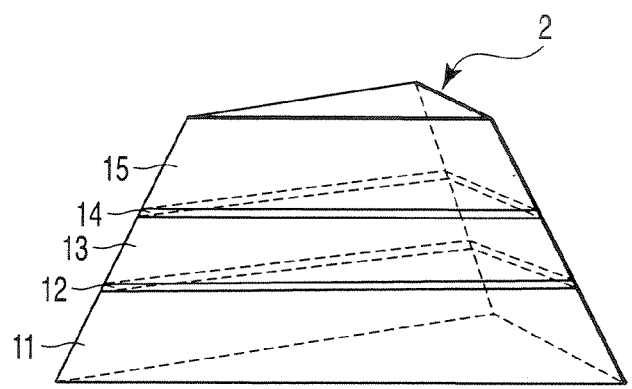
FIG. 6 is an perspective diagram of the magnetoresistive element according to the invention's other embodiments.

As indicated in FIG. 4, the ferromagnetic layers 13 and 15 are composed of ferromagnetic materials. The side facing the front (hereinafter referred to as "foreside") in the ferromagnetic layers 13 and 15 in FIG. 4 extend in a direction intersecting the surface of the semiconductor substrate 1. As a classic example, the foreside is perpendicular to the surface of the semiconductor substrate 1.

Magnetization under the state (statict state) without an external magnetic field applied to the ferromagnetic layers 13 and 15 is along the foreside of the ferromagnetic layers 13 and 15. Then, the magnetization direction of the ferromagnetic layers 13 and 15 changes along the foreside of the ferromagnetic layers 13 and 15. Moreover, the magnetization anisotropy direction (easy magnetization axis) of the ferromagnetic layers 13 and 15 is along the foreside in the direction that is neither parallel nor perpendicular to the surface of the semiconductor substrate 1. In other words, it is oblique to the surface of the semiconductor substrate 1. As a typical example, the magnetization anisotropy direction is at an approximately 45° degree angle to the surface of the semiconductor substrate 1.

Ferromagnetic layer 13 and ferromagnetic layer 15 are antiferromagnetically coupled by the nonmagnetic layer 14. In other words, the magnetization direction of ferromagnetic layer 13 and the magnetization direction of ferromagnetic layer 15 are anti-parallel in a static state. Therefore, each easy magnetization axis of ferromagnetic layer 13 and ferromagnetic layer 15 are practically along the same direction. The nonmagnetic layer 14 is composed so as to antiferromagnetically couple ferromagnetic layer 13 and ferromagnetic layer 15, and is composed of nonmagnetic materials. For example, Ru, which offers stable antiferromagnetic coupling, can be used as a nonmagnetic material.

The magnetoresistive element 2 retains one bit of data in accordance with each magnetization direction of ferromagnetic layer 13 and ferromagnetic layer 15 to the magnetization direction of ferromagnetic layer 11. For example, when magnetization of ferromagnetic layer 13 is facing one of the two directions along the easy magnetization axis, the state can be a "0" data retention state, and when it is facing the other one of the two directions, the state can be a "1" data retention state. Hereinafter, ferromagnetic layer 13 and ferromagnetic layer 15 are referred to as the lower recording layer (magnetization free layer) 13 and the upper recording layer (magnetization free layer) 15, respectively.

It is desirable for the aspect ratio of the height (thickness)/width of the lower recording layer 13 and upper recording layer 15 to be 1 or higher. This can easily direct and fix the magnetization anisotropy direction of the lower recording layer 13 and upper recording layer 15 oblique to the surface of the semiconductor substrate 1. In the scope of the present specification and claims, the aspect ratio refers to the ratio of the height (thickness) to the maximum width of the bottom surface shape of the target.

Ferromagnetic layer 11 has a fixed magnetization direction. Hereinafter, ferromagnetic layer 11 is referred to as a fixed layer (reference layer, magnetization fixed layer). The fixed layer 11 can consist of, for example, stacked ferromagnetic layer and antiferromagnetic layer. The magnetization direction of the fixed layer 11 should be facing the direction that can distinguish the "0" data from the "1" data by the relative direction to the magnetization direction of the lower recording layer 13. As a typical example, the magnetization direction of the fixed layer 11 is along the easy magnetization axis of the lower recording layer 13 and the upper recording layer 15. However, as long as it is possible to retain binary data as stated above, each layer that composes the magnetoresistive element 2 may face the direction along the side where each layer interfaces (bonded surface, film surface) although the read signal is reduced.

It is also preferable for the aspect ratio of fixed layer 11 to be around 1 or higher. This facilitates the setting of the magnetization of the fixed layer 11 oblique to the surface of the semiconductor substrate 1 can be easily done.

Data reading is, for example, implemented by determining the resistance value according to the magnetoresistive effect between the lower recording layer 13 and the fixed layer 11 that sandwiche the nonmagnetic layer 12. For example, when the magnetization direction of the lower recording layer 13 and the magnetization direction of the fixed layer 11 are parallel to each other, the state can be the "0" data retention state, and when they are anti-parallel can be the "1" data state, vice versa.

The nonmagnetic layer 12 is composed of nonmagnetic materials. In order to enhance the magnetic resistance effect of the magnetoresistive element 2, material can be used that is able to make the nonmagnetic layer 12 function as a tunneling barrier layer. As an example of such material, $AlO_2$ can be used.

The following methods can be used as examples for assigning magnetization anisotropy to the fixed layer 11, the recording layers 13 and 15 in an oblique direction to the surface of the semiconductor substrate 1 within the foreside.

The first method involves using an induced magnetic anisotropy of magnetic materials to incline the magnetization direction. For example, this method is realized through a film formation of the fixed layer 11, recording layer 13, and recording layer 15 under the magnetic field whose direction is along with required anisotropy direction. Alternatively, it is also possible to anneal recording layer 13 and recording layer 15 under the magnetic field whose direction is along with required anisotropy direction after film formation.

The second method involves using the shape of the magnetoresistive element 2. This method is, for example, realized by cutting off one of the edges that comprise the top of the upper recording layer 15 in FIG. 5 to make a beveled corner 21. The beveled corner 21 makes the magnetization avoid facing the beveled corner 21, so anisotropy is assigned along the beveled corner 21, or in other words, diagonally across the surface of the semiconductor substrate 1. According to this method, the direction of magnetization of the lower recording layer 13 takes a parallel and opposite direction to the anisotropy direction of the recording layer 15 because the lower recording layer 13 is antiferromagnetically coupled with the upper recording layer 15.

The third method also involves using the shape of the magnetoresistive element 2. The method also can be realized by creating the layers without the edge (side) that is perpendicular to the foreside of the magnetoresistive element 1, in other words, to a side along which the magnetization spin. To be more specific, making the shape of the bonded surface into a triangle in FIG. 6 can be one example. Moreover, each side, including the foreside, can be a trapezoid in this case. The magnetic anisotropy can be assigned in the direction along the foreside in the fixed layer 11, lower recording layer 13, and upper recording layer 15 by the third method as well.

In addition, when using the third method, similar to the first method, the magnetic anisotropy of the desired direction can be assigned to the fixed layer 11, lower recording layer 13, and upper recording layer 15 by annealing under the magnetic field facing the direction oblique to the surface of the semiconductor substrate 1 on the foreside.

In addition, for the magnetoresistive element 2, it is desirable for the shape of the bonded surface (film surface) to be a rectangular that extends in a horizontal direction as in FIG. 1. This can facilitate setting of the magnetic anisotropy direction of the fixed layer 11 and recording layers 13 and 15 along the foreside of the magnetoresistive element 2. Moreover, the area of the bonded surface of the magnetoresistive element 2 can be kept small. These shapes are achieved by a so-called slimming process: two lithography processes using resist or mask material that is common in the process of manufacturing semiconductor devices.

As indicated in FIG. 1 to FIG. 3, the upper side of the upper recording layer 15 is connected to the bottom of the write line (upper write line) 3. An electrode consisting a metal film can be placed between the upper recording layer 15 and the upper write line 3. The upper write line 3 extends along a direction to transpierce the foreside of the magnetoresistive element 2, and as a typical example, along a direction perpendicular to the foreside.

The write line (lower write line) 4 is provided facing the foreside or the side (backside) opposite to it of the magnetoresistive element 2. The lower write line 4 can be provided on both the foreside and backside of the magnetoresistive element 2 (the diagram illustrates both). The lower write line 4 is separate from the magnetoresistive element 2 and is not electrically connected. The write line 4 extends along the surface of the semiconductor substrate 1 and is parallel to the foreside of the magnetoresistive element 2. The location of the write line 4 in the vertical direction is at least the same as the lower recording layer 13 or upper recording layer 15, but more commonly, the location covers both the lower recording layer 13 and upper recording layer 15. In the most common example, the write line 4 is located on the side between the lower recording layer 13 and upper recording layer 15, that is, the side of the nonmagnetic layer 14.

Figure 7:
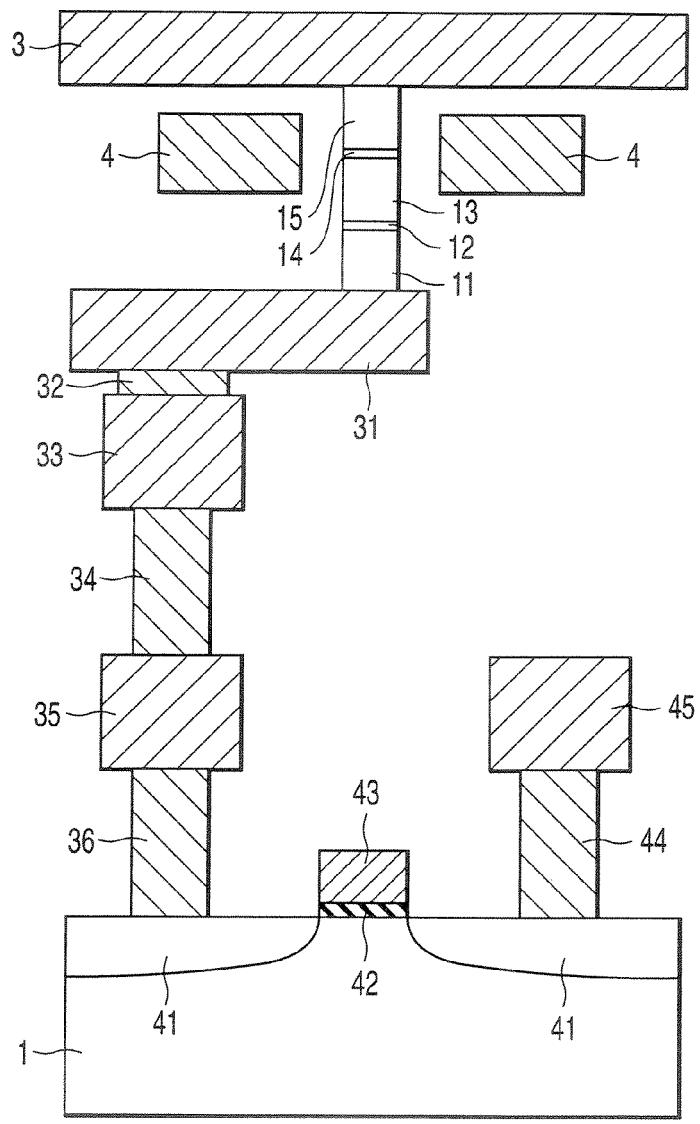
FIG. 7 is a cross-sectional diagram of a major part of the magnetic memory device according to the invention's embodiments.

A memory cell can be realized by a magnetoresistive element 2 and a selection transistor. FIG. 7 is a cross-section diagram of a magnetic memory device according to the embodiment of this invention and describes an example of a memory cell.

As shown in FIG. 7, the bottom (bottom of the fixed layer 11) of the magnetoresistive element 2 in FIG. 1 to FIG. 6 is connected to the lower electrode 31.

The lower electrode 31 is electrically connected to the surface of the semiconductor substrate 1 via the wiring layer 32, conductive layer 33, plug 34, wiring layer 35, and plug 36, which are provided in that order from the top. A pair of the source/drain diffusion regions 41 is provided on the surface of the semiconductor substrate 1. One of the source/drain diffusion regions 41 is located under plug 36 and is connected to plug 36.

The gate electrode 43 is provided on the surface of the semiconductor substrate 1 between the source/drain diffusion regions 41, having the gate insulator 42 therebetween. The gate insulator 42 and gate electrode 43, for example, are located just below the magnetoresistive element 2. The other one of the source/drain diffusion regions 41 is electrically connected to the wiring layer 45 via plug 44.

The source/drain diffusion regions 41, gate insulator 42, and gate electrode 43 compose a selection transistor. When reading data from a memory cell, a current path is formed by turning on the selection transistor of the memory cell of the reading target. Then, a current introduced from the upper write line 3 through the magnetoresistive element 2 is supplied to the transistor. The value of the current or the voltage corresponding to the current is compared to the reference electric potential or reference voltage by, for example, a sense amplifier to determine the data retained by the magnetoresistive element 2.

Next, writing to the magnetic memory device of the embodiment is described referring to FIG. 8 to FIG. 12. In the following description, an example with two lines of the lower write line 4 is explained. The direction of the magnetic field applied when using one line of the magnetoresistive element 2 is the same as when using two lines, so the behavior of magnetization of the lower recording layer 13 and upper recording layer 15 are the same as when using one line of the write line 4.

Note that toggle writing carries out writing when written data is incongruous with data retained by the magnetoresistive element of the write target. Therefore, in a magnetic memory device that adopts toggle writing, reading is implemented before writing.

The following write current is supplied by the write current circuit connected to the upper write line 3 and lower write line 4. These will be described later referring to FIG. 13.

Figure 8:
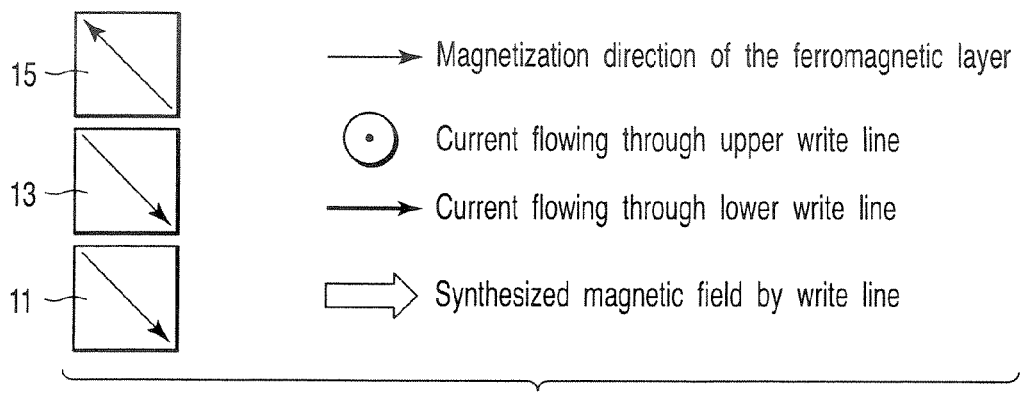
FIG. 8 shows a state of write operation of the magnetic memory device according to the invention's embodiments.

As shown in FIG. 8, in the initial state (static state), for example, the fixed layer 11 and lower recording layer 13 are parallel. The magnetic anisotropy of the fixed layer 11, lower recording layer 13, and upper recording layer 15 are along the direction that connects the upper left to the lower right.

In static state, the write current does not flow in the upper write line 3 and lower write line 4. Therefore, no magnetic field is applied to the magnetoresistive element 2 (the lower recording layer 13 and upper recording layer 15).

Figure 9:
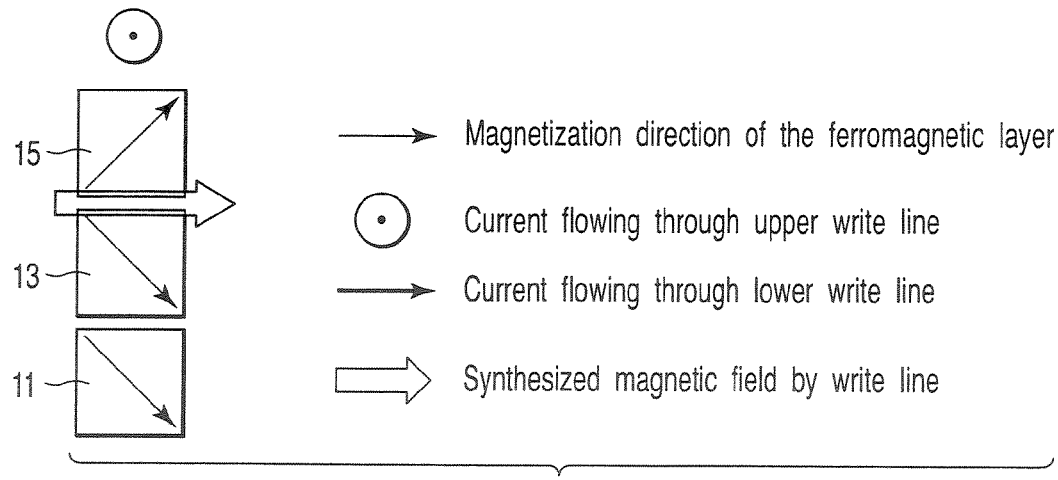
FIG. 9 shows a state subsequent to FIG. 8.

Next, as shown in FIG. 9, the write current, which flows from the back to front of a paper, is supplied to the upper write line 3. The magnetic field that faces the right is applied to the lower recording layer 13 and upper recording layer 15 by the write current. Consequently, from the balance between the antiferromagnetic coupling, the torque received from the applied magnetic field, and the magnetic anisotropy of the lower recording layer 13 and upper recording layer 15, magnetization of the upper recording layer 15 turns clockwise to face the upper right. The magnetization direction of the lower recording layer 13 does not change.

Figure 10:
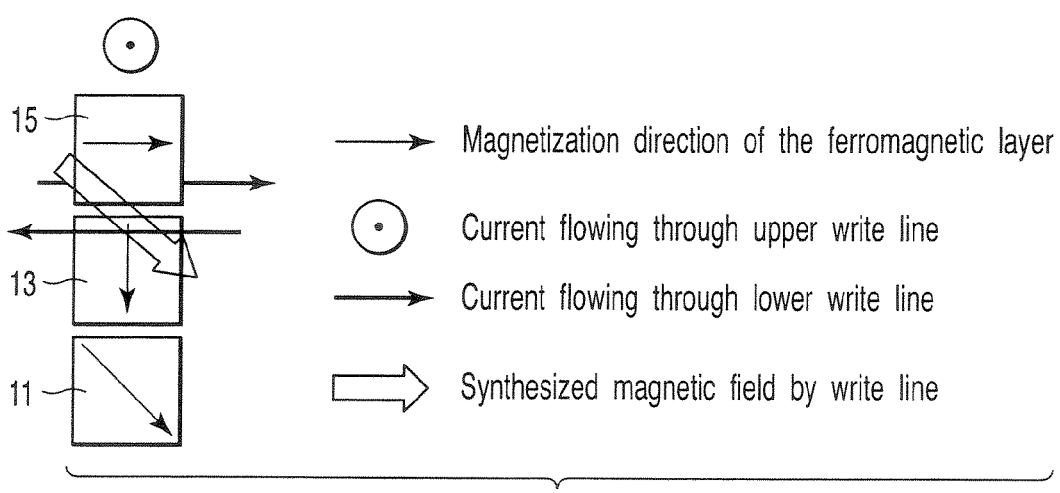
FIG. 10 shows a state subsequent to FIG. 9.

Next, as shown in FIG. 10, a write current is supplied to the lower write line 4 as the write current that flows in the upper write line 3 is maintained. The direction of the two lines of write current that flows in the lower write line 4 are opposite each other. The write current flows from right to left of the lower write line 4 that is in front of the magnetoresistive element 2 and flows from left to right of the lower write line 4 that is behind the magnetoresistive element 2.

The magnetic field that faces downward is applied to the lower recording layer 13 and upper recording layer 15 by the write current that flows in the lower write line 4. As a result, a synthetic magnetic field that faces the lower right from the upper left is applied to the lower recording layer 13 and upper recording layer 15. By this application of a synthetic magnetic field, magnetization of the upper recording layer 15 turns clockwise to face right, and magnetization of the lower recording layer 13 turns clockwise to face downward.

When two lines of the lower write line 4 are provided, the synthetic magnetic field of the two lines of the lower write line 4 only needs to be large enough to direct the magnetization of the lower recording layer 13 and upper recording layer 15 along the direction indicated in FIG. 10. Therefore, the write currents that flows in the lower write line 4 as well as the magnetic field that is generated from the write current are less than that of when there is only one lower write line 4. Thus, when there is an adjoining magnetoresistive element, it is possible to greatly reduce a leakage magnetic field to be applied to the adjoining magnetoresistive element.

Two lines of the lower write line 4 can efficiently apply a magnetic field to the magnetoresistive element 2 as stated above to easily control magnetization of the lower recording layer 13 and upper recording layer 15. Therefore, by appropriately setting the intensity of the magnetic field from the lower write line 4 and upper write line 3, even if the aspect ratio of each magnetic layer of the magnetoresistive element 2 is less than 1, it is possible to accomplish the writing that is described in the embodiment.

Figure 11:
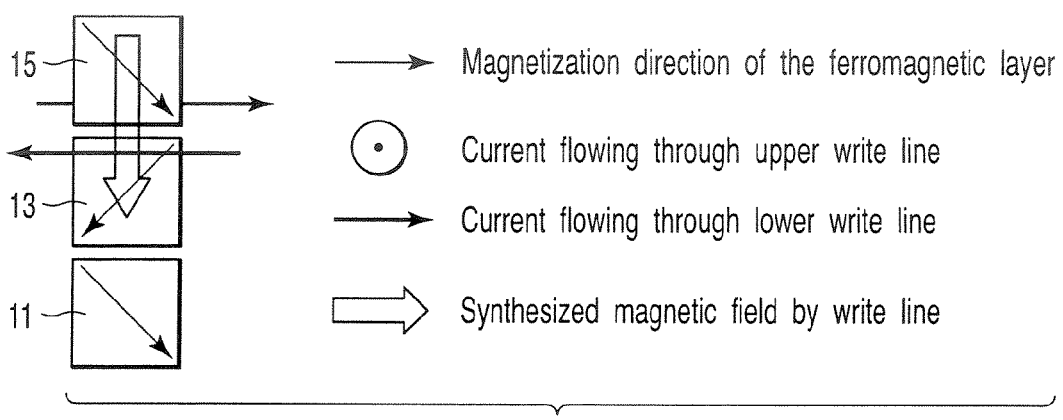
FIG. 11 shows a state subsequent to FIG. 10.

Next, as indicated in FIG. 11, supply of write current to the upper write line 3 is stopped as the current that flows in the lower write line 4 is maintained. As a result, the magnetic field that is applied to the lower recording layer 13 and upper recording layer 15 faces downward. The application of magnetic field turns magnetization of the upper recording layer 15 clockwise to face the lower right and turns magnetization of the lower recording layer 13 clockwise to face the lower left. Therefore, magnetization of the upper recording layer 15 faces the opposite direction (180 degrees) from the initial state (FIG. 8) at this point.

Figure 12:
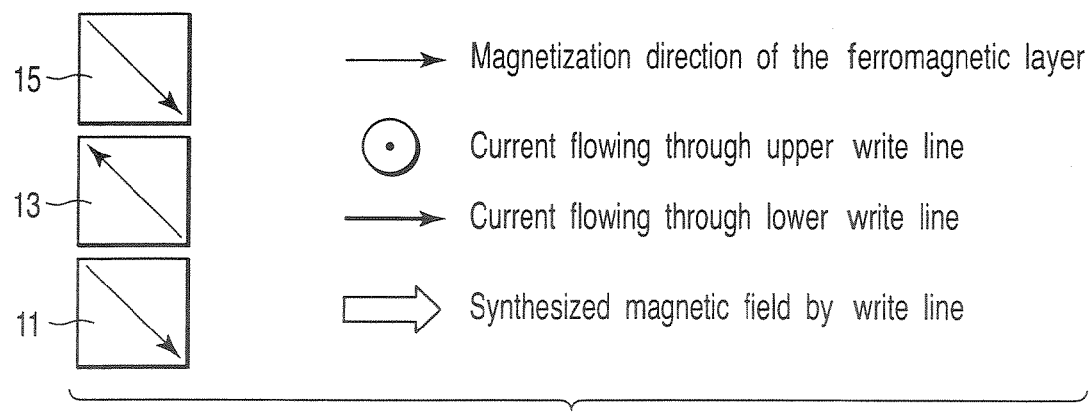
FIG. 12 shows a state subsequent to the FIG. 11.

Next, as indicated in FIG. 12, the supply of the write current to the lower write line 4 is also stopped. As a result, magnetization of the lower recording layer 13 attempts to be anti-parallel to the magnetization direction of the upper recording layer 15 and face a direction along the easy magnetization axis. In other words, it turns clockwise to face the upper left. From the above actions, the magnetization directions of the lower recording layer 13 and upper recording layer 15 face opposite directions.

FIG. 8 to FIG. 12 show an example wherein magnetization of the lower recording layer 13 and magnetization of the fixed layer 11 are changed from anti-parallel to parallel. However, it is possible to turn from parallel to anti-parallel by using exactly the same (including the direction of power distribution of the write current) process.

Figure 13:
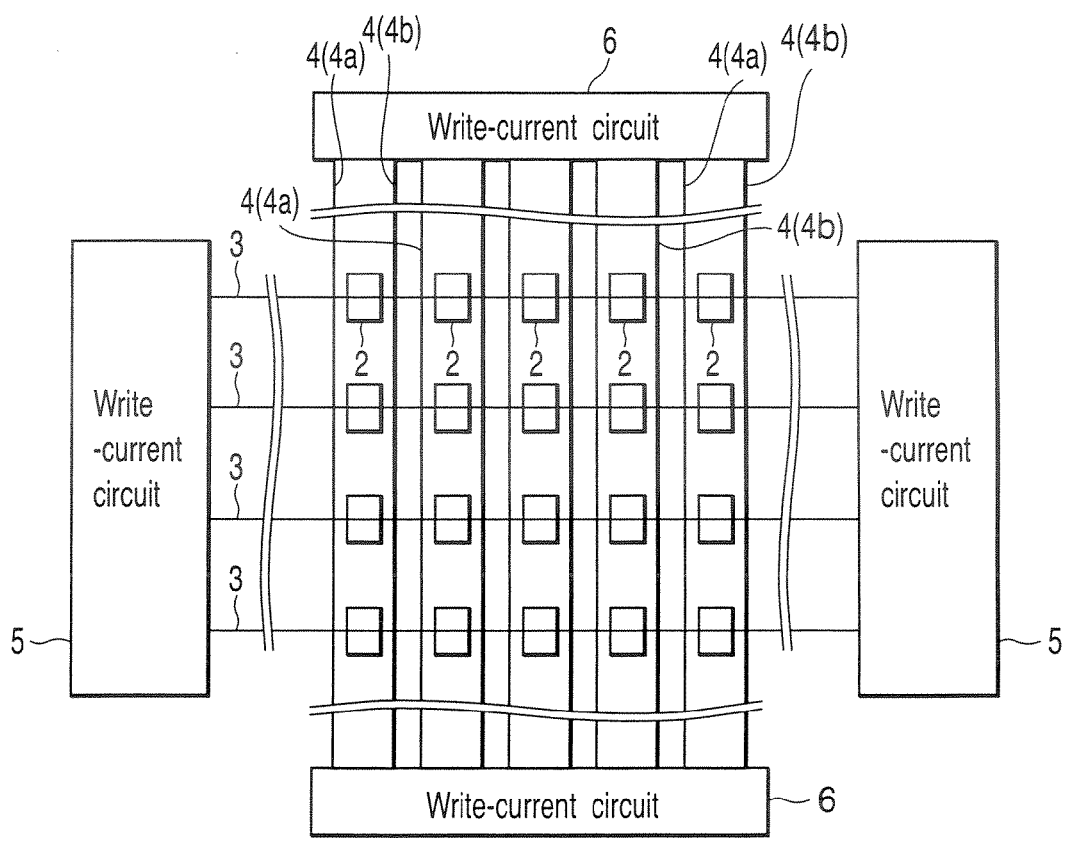
FIG. 13 shows the configuration and layout of a memory cell array and write current circuit of the magnetic memory device according to the invention's embodiments.

A memory cell array can be composed by arranging multiple memory cells shown in FIG. 7 in a matrix. The configuration for supplying current to the memory cell array, upper write line 3, and lower write line 4 is described by referring to FIG. 13 to FIG. 17. FIG. 13 shows a magnetic memory device according to the embodiment of the present invention and shows the configuration and layout of the memory cell array and write current circuit.

As shown in FIG. 13, for example, a memory cell array is composed by arranging memory cells (magnetoresistive element 2) shown in FIG. 7 into a matrix. Two lines of the lower write line 4 are provided for one line formed by the memory cells. Both ends of the upper write line 3 are connected to a write current circuit 5 that is provided outside the memory cell array. Similarly, both ends of the lower write line 4 are connected to a write current circuit 6 that is provided outside the memory cell array.

Write current circuits 5 and 6 supply write currents to the upper write line 3 and lower write line 4 specified by responding to the address signal supplied by a decoder (not shown). Write current circuits 5 and 6 are composed such that it is possible to supply write currents in the directions indicated in FIG. 8 to FIG. 12. More specifically, of one pair of write current circuit 5, one side includes at least one source circuit that supplies a write current to at least one upper write line 3 that is specified by the address signal. The other side includes at least one sink circuit that draws out current from at least one upper write line 3 that is specified by the address signal.

On the other hand, write current circuit 6 is composed such that a write current is supplied from top to bottom and from bottom to top, respectively to the lower write line (hereafter called, the lower write line 4a) on the left side of the memory cell, and the lower write line 4 (hereafter called, the lower write line 4b) on the right side. When the directions are opposite each other, it is also possible to perform this operation using the same description as follows.

First, write current circuit 6 includes at least one source circuit that supplies a write current to at least one upper write line 3 specified by the address signal and at least one sink circuit that draws out the current from at least one upper write line 3 specified by the address signal. The source circuit is connected to lower write line 4a and the sink circuit is connected to lower write line 4b in the write current circuit 6 of the upper side. For the write current circuit of the lower side, the source circuit is connected to write line 4b, and the sink circuit is connected to write line 4a.

FIG. 14 illustrates the source circuit that is included in write current circuits 5 and 6. As shown in FIG. 14, the source circuit SO is, as a typical example, comprised of a serially connected constant current source 1 and a switching circuit SW1 such as a transistor.

The ends opposite the constant current source of the switching circuit SW1 are connected to each end of the switching circuits SW2, such as transistors, and the other ends of the switching circuit SW2 are connected to the upper write line 3 or lower write line 4 (4a, 4b). Turning on/off switching circuit SW1 and switching circuit SW2 are accomplished by a control signal from the decoder.

FIG. 15 illustrates a sink circuit that is included in write current circuits 5 and 6. As shown in FIG. 15, the sink circuit SN, as a classic example, is comprised of switching circuit SW3 such as transistors. One end of switching circuit SW3 is connected to the end of the common potential (ground), and the other ends are connected to each end of switching circuits SW4. The other ends of switching circuit SW4 are connected to the upper write line 3 or lower write line 4 (4a, 4b). Turning on/off switching circuit SW3, and switching circuit SW4 are accomplished by a control signal from the decoder.

Figure 16:
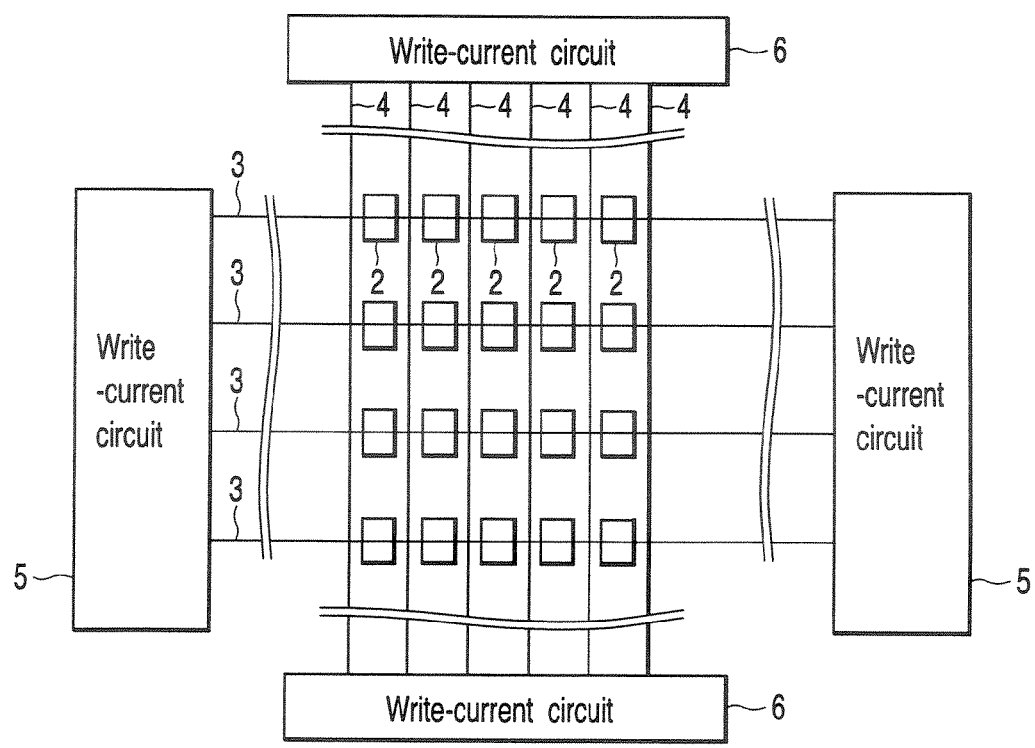
FIG. 16 shows other examples of the configuration and layout of a memory cell array and write current circuit of the magnetic memory device according to the invention's embodiments.

It is also possible to share write line 4 between the adjoining two lines. FIG. 16 shows a magnetic memory device according to the embodiment of the present invention, and shows other examples of the configuration and layout of the memory cell array and write current circuit.

As shown in FIG. 16, one line of the lower write line 4 is provided between the two lines of the memory cells. With the configuration of FIG. 16, bidirectional current needs to flow in the lower write line 4. Therefore, write current circuit 6 includes at least two source/sink circuits SS which supply a current to the specified lower write line 4 and draw out a current from the specified lower write line 4.

When writing, the source/sink circuit SS which is connected to one end (such as the upper end) of the lower write line 4 positioned at one side of the lines of memory cells that include the write target one operates as a source circuit, and the source/sink circuit SS connected to the other ends (such as the bottom end) operates as a sink circuit.

On the other hand, the source/sink circuit SS which is connected to one end (such as the upper end) of the lower write line 4 positioned at the other side of the lines of memory cells that include the write target one operates as a sink circuit, and the source/sink circuit SS connected to the other end (such as the bottom end) operates as a source circuit.

As for write current circuit 5, it is the same as the embodiment of FIG. 13.

Figure 17:
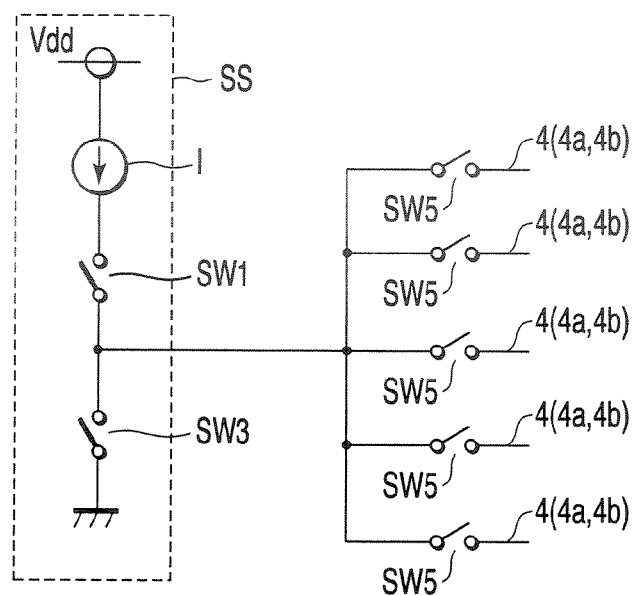
FIG. 17 shows a source-sink circuit.

FIG. 17 illustrates the source/sink circuit SS, which is included in write current circuit 6. As shown in FIG. 17, the source/sink circuit SS, for example, is comprised of a serially connected constant current source 1 and switching circuits SW1 and SW2. The opposite end of switching circuit SW2 to the switching circuit SW1 is connected to the end of the common potential.

The connection nodes of switching circuit SW1 and switching circuit SW2 are connected to each end of the switching circuits SW 5 such as transistors. The ends of switching circuit SW5 are connected to the lower write line 4 (4a, 4b).

According to the magnetic memory device of the embodiments of the present invention, the magnetization direction of the lower recording layer 13 and upper recording layer 15 rotates within the side (perpendicular side as a typical example) that intersects the direction in which the lower recording layer 13 and upper recording layer 15 are stacked. This can reduce the area of bonded surface of the magnetoresistive element 2, and it is smaller than the bonded surface of magnetoresistive elements for conventional toggle writing. Therefore, size of a cell composed by the magnetoresistive element 2 and a selection transistor is as small as about 4 to 6F$^2$.

Further, high aspect ratio (1 or higher, for example) of the magnetoresistive element 2 of the embodiment can ensure a large volume for magnetoresistive element 2, even with a smaller cross-sectional area compared to conventional area. Therefore, the thermal disturbance resistance of the magnetoresistive element 2 is high, or in other words, the long-term reliability of retention of data is high.

The excessive strong coupling force produced by Ru that is commonly used as a nonmagnetic layer between two ferromagnetic layers that comprise a recording layer requires a large writing magnetic field. In contrast, the area where the lower recording layer 13 and upper recording layer 15 face the nonmagnetic layer 14 is small in the embodiment. This can reduce the magnetic field required for writing, and thus, the write current is smaller than the conventional technique.

In addition, the resistance to erroneous writing, which toggle writing can naturally provide, is further improved. This point is explained below. An example is described with reference to FIG. 18, explaining how possible erroneous writing to magnetoresistive elements (the magnetoresistive elements in the direction of the back of paper in FIG. 1, for example), which share the upper write line 3 with the selected magnetoresistive elements and is adjacent to the magnetoresistive elements of the selected memory cell (selected magnetoresistive element). FIG. 18 shows a wider area of the same cross-section of FIG. 3.

As shown in FIG. 18, the magnetic field that faces the front of the paper from the is applied to the selected magnetoresistive element 2a and to the adjoining magnetoresistive element 2b by the write current 13 that flows in the upper write line 3. Next, the bottom facing magnetic fields Ba and Bb are applied to the selected magnetoresistive element 2a by the write current that flows in the lower write lines 4a and 4b.

The magnetic field Bc from the write current that flows in the lower write line 4b is also applied to the adjoining magnetoresistive element 2b. However, its direction is upward. Therefore, in principle, it is impossible to write to the adjoining magnetoresistive element 2b, because the order necessary for toggle writing and the direction of the magnetic field are not applied to the adjoining magnetoresistive element 2b. In other words, resistance to erroneous writing to the adjoining magnetoresistive elements in the magnetic resistance memory device of the embodiment is extremely high.

As described above, according to the embodiments of the present invention, it is possible to realize a magnetic memory device having a small area of cells, small write current, high thermal disturbance resistance, and high resistance to erroneous writing.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic memory device comprising:
a semiconductor substrate;
a magnetization fixed layer provided above a surface of the semiconductor substrate and having a fixed magnetization direction;
a first magnetization free layer provided above the magnetization fixed layer, having variable magnetization direction, and having an easy magnetization axis which extends along a plane intersecting the surface of the semiconductor substrate and along a direction neither parallel nor perpendicular to the surface of the semiconductor substrate;
a second magnetization free layer provided above the first magnetization free layer, having a magnetization that antiferromagnetically couples with the first magnetization free layer when no external magnetic field is applied;
a first write line provided above and electrically connected to the second magnetization free layer, and extending in a direction that pierces the plane; and
a second write line facing at least one of the first magnetization free layer and the second magnetization free layer, and extending along the surface of the semiconductor substrate and the plane and in a direction perpendicular to the first write line.

2. The device according to claim 1, wherein
the aspect ratio of the first magnetization free layer and the second magnetization free layer is 1 or higher.

3. The device according to claim 1, wherein
a surface of the first magnetization free layer which faces the second magnetization free layer and a surface of the second magnetization free layer which faces the first magnetization free layer are rectangular which extend along the first write line.

4. The device according to claim 1, wherein
the easy magnetization axis of the first magnetization free layer and an easy magnetization axis of the second magnetization free layer are substantially inclined 45 degree from the surface of the semiconductor substrate.

5. The device according to claim 1, wherein
a magnetization direction of the magnetization fixed layer is along the easy magnetization axis of the first magnetization free layer and an easy magnetization axis of the second magnetization free layer.

6. The device according to claim 1, wherein the first write line and the second write line intersect each other and extend along the surface of the semiconductor substrate.

7. The device according to claim 1, wherein an edge that connects an upper surface and side surface of the second magnetization free layer is cut off to form a beveled corner.

8. The device according to claim 1 further comprising:

a first write current circuit connected to the first write line; and a second write current circuit connected to the second write line;

wherein, the first write current circuit supplies a first current to the first write line, the second write current circuit supplies a second current to the second write line with supply of the first current maintained, the supply of the first current is stopped with supply of the second current maintained, and the supply of the second current is stopped without the supply of the first current.

9. The device according to claim 1 further comprising:

a third write line extending parallel to the second write line, the second write line and the third write line sandwiching the second magnetization free layer.

10. The device according to claim 9, wherein the second write line and the third write line are supplied with currents flowing in opposite directions from each other in a process of reversing magnetization of the first magnetization free layer and the second magnetization free layer.

11. The device according to claim 9, wherein the aspect ratio of the first magnetization free layer and the second magnetization free layer is 1 or higher.

12. The device according to claim 9, wherein a surface of the first magnetization free layer which faces the second magnetization free layer and a surface of the second magnetization free layer which faces the first magnetization free layer are rectangular which extend along the first write line.

13. The device according to claim 9, wherein the easy magnetization axis of the first magnetization free layer and an easy magnetization axis of the second magnetization free layer are substantially inclined 45 degree from the surface of the semiconductor substrate.

14. The device according to claim 9, wherein a magnetization direction of the magnetization fixed layer is along the easy magnetization axis of the first magnetization free layer and an easy magnetization axis of the second magnetization free layer.

15. The device according to claim 9, wherein the first write line and the second write line intersect each other and extend along the surface of the semiconductor substrate.

16. The device according to claim 9, wherein an edge that connects an upper surface and side surface of the second magnetization free layer is cut off to form a beveled corner.

17. The device according to claim 9 further comprising:

a first write current circuit connected to the first write line; and a second write current circuit connected to the second write line;

wherein, the first write current circuit supplies a first current to the first write line, the second write current circuit supplies a second current to the second write line with supply of the first current maintained, the supply of the first current is stopped with supply of the second current maintained, and the supply of the second current is stopped without the supply of the first current.

* * * * *